United States Patent
Dong et al.

(10) Patent No.: US 10,152,339 B1
(45) Date of Patent: Dec. 11, 2018

(54) METHODS AND APPARATUS FOR SERVER CACHING SIMULATOR

(71) Applicant: EMC Corporation, Hopkinton, MA (US)

(72) Inventors: Xin Dong, Hopkinton, MA (US); Gerald Cotter, Hopkinton, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 1087 days.

(21) Appl. No.: 14/314,377

(22) Filed: Jun. 25, 2014

(51) Int. Cl.
*G06F 9/455* (2018.01)

(52) U.S. Cl.
CPC .................................. *G06F 9/455* (2013.01)

(58) Field of Classification Search
CPC ...................................................... G06F 9/455
USPC ........................................................... 703/22
See application file for complete search history.

(56) References Cited

U.S. PATENT DOCUMENTS

| | | |
|---|---|---|
| 8,024,171 B1 | 9/2011 | Korolev |
| 8,874,966 B1 | 10/2014 | Garrett, Jr. et al. |
| 8,924,595 B1 | 12/2014 | Joyce et al. |
| 8,938,477 B1 | 1/2015 | Tang et al. |
| 9,069,797 B1 | 6/2015 | Aliev et al. |
| 9,170,904 B1 | 10/2015 | LeCrone et al. |
| 2005/0138165 A1* | 6/2005 | Tang .................. H04N 21/2181 709/224 |
| 2007/0233638 A1* | 10/2007 | Carroll .............. G06F 17/30587 |
| 2008/0140525 A1 | 6/2008 | Lamsfuss et al. |
| 2010/0274827 A1* | 10/2010 | Hix .................... G06F 17/30085 707/813 |
| 2012/0317355 A1 | 12/2012 | Ishizaki et al. |
| 2013/0097377 A1 | 4/2013 | Satoyama et al. |
| 2013/0173859 A1* | 7/2013 | Gorrell ................ G06F 3/0617 711/112 |
| 2013/0198459 A1 | 8/2013 | Joshi et al. |
| 2013/0339599 A1 | 12/2013 | Sundrani |
| 2014/0058717 A1 | 2/2014 | Fukumoto et al. |
| 2014/0101158 A1* | 4/2014 | Kraemer .......... G06F 17/30221 707/737 |
| 2015/0081981 A1 | 3/2015 | McKean et al. |
| 2015/0113223 A1 | 4/2015 | Brown et al. |
| 2015/0143053 A1 | 5/2015 | Quimbey et al. |
| 2015/0220396 A1 | 8/2015 | Shirley, Jr. et al. |
| 2015/0242133 A1 | 8/2015 | Smith et al. |

OTHER PUBLICATIONS

Screen Shots of mp4 Video Presented on May 8, 2013 for notional cache simulator; 5 Pages.
Vidra, "Simulation Fulfills Its Promise for Enhancing Debug and Analysis;" A Texas Instruments White Paper—SPRA991; Jan. 2004; 7 Pages.

(Continued)

*Primary Examiner* — Saif A Alhija
(74) *Attorney, Agent, or Firm* — Daly, Crowley Mofford & Durkee, LLP (57) ABSTRACT

Methods and apparatus for receiving a selection of disks in a storage system for simulation in a simulator of a server cache application, receiving simulation parameters, running a simulation for the disk selection, and examining results of the simulation. After examination of the results, simulation parameters can be adjusted and the simulation re-run for a disk selection.

20 Claims, 10 Drawing Sheets

(56) References Cited

OTHER PUBLICATIONS

Oracle, "Improving WebCenter Spaces Performance with Oracle Web Cache;" An Oracle White Paper; Feb. 2010; 9 Pages.
Tensilica, "Optimize SOC Performance Using Memory Tuning and System Simulation;" A Tensilica White Paper based on the Book *Engineering the Complex SOC*; Oct. 24, 2008; 8 Pages.
Response to U.S. Office Action dated May 16, 2016 corresponding to U.S. Appl. No. 14/314,380; Response filed on Sep. 16, 2016; 10 Pages.
Real Time Xtremcache Simulator for Linux, User Guide, EMC Flash Products Division, Oct. 2013, 39 pages, $EMC^2$.
Real Time Xtremcache Simulator for Windows, User Guide, EMC Flash Products Division, Oct. 2013, 52 pages, $EMC^2$.
Design Guide, EMC VSPEX With EMC Xtremsf and EMC Xtremsw Cache, EMC VSPEX, May 2013, 84 pages, $EMC^2$.
Design Guide, EMC VSPEX With EMC Xtremsf and EMC Xtremcache, EMC VSPEX, Dec. 2013, 95 pages, $EMC^2$.
White Paper, Introduction to EMC Xtremcache, Nov. 2013, 33 pages, $EMC^2$.
U.S. Appl. No. 14/314,380, filed Jun. 25, 2014, Dong et al.
U.S. Appl. No. 14/314,380, filed Jun. 25, 2014.
Office Action dated May 16, 2016; for U.S. Appl. No. 14/314,380; 18 pages.
U.S. Final Office Action dated Nov. 3, 2016 corresponding to U.S. Appl. No. 14/314,380; 22 Pages.

\* cited by examiner

| Cache Device Test Engine Parameter | | | | Page Size | 64K |
|---|---|---|---|---|---|
| Target LUN 1 | Time | | | Reads % | 0 |
| | | | | Access Pattern | Random |
| No. | Disk | ID | Size (GB) | IO Depth | 1 |
| 0 | \\.\PhysicalDrive0 | 0 | 465 | ☐ Preconditioning | |
| 1 | \\.\PhysicalDrive1 | 1 | 750 | Iteration Periods (s) | 10 |
| 2 | \\.\PhysicalDrive2 | 2 | 750 | MAX IOPS | 1280 |
| 3 | \\.\PhysicalDrive3 | 3 | 750 | | |
| 4 | \\.\PhysicalDrive4 | 4 | 750 | Total IOs | |
| 5 | \\.\PhysicalDrive5 | 5 | 750 | | |
| 6 | \\.\PhysicalDrive6 | 6 | 750 | IOPS (R/W) | |
| 7 | \\.\PhysicalDrive7 | 7 | 750 | | |
| 8 | \\.\PhysicalDrive8 | 8 | 750 | Latency (R/W us) | |
| 9 | \\.\PhysicalDrive9 | 9 | 652 | | |
| 10 | \\.\PhysicalDrive10 | 10 | 430 | Start | |
| 11 | \Device\Harddisk0\Partition0 | 0 | 465 | | |
| 12 | \Device\Harddisk0\Partition1 | 0 | 465 | | |
| 13 | \Device\Harddisk0\Partition2 | 0 | 465 | | |
| 14 | \Device\Harddisk0\Partition3 | 0 | 465 | | |
| 15 | \Device\Harddisk1\Partition0 | 1 | 750 | | |
| 16 | \Device\Harddisk2\Partition0 | 2 | 750 | | |
| 17 | \Device\Harddisk3\Partition0 | 3 | 750 | | |
| 18 | \Device\Harddisk4\Partition0 | 4 | 750 | | |
| 19 | \Device\Harddisk5\Partition0 | 5 | 750 | | |

METHODS AND APPARATUS FOR SERVER CACHING SIMULATOR

BACKGROUND

As known in the art, a server caching application can increase performance of a storage system by obtaining data from cache device instead of backend storage. As is also known, there are a number of parameters that determine the impact of caching performance. That is, caching can provide significant or little benefit depending upon the configuration of the storage system and the IO operations that are performed by the application accessing the storage. It can be challenging to determine the benefit of a server caching application on a storage system.

SUMMARY

In one aspect of the invention, a method comprised: receiving a selection of disks in a storage system for simulation in a simulator of a server cache application; receiving simulation parameters; running a simulation for the disk selection; examining results of the simulation; adjusting ones of the simulation parameters; and re-running the simulation for the disk selection.

The method can further include one or more of the following features: the simulation parameters include cache page size, cache utilization limit, and IO skip size, determining whether a IOPS threshold is exceeded, adjusting one of the simulation parameters such that a cache page size equals an average IO size, a cache device has a size greater than or equal to an active working set size, a cache utilization limit is greater than or equal to the active working set size, or an IO skips size is greater than a cache page size, terminating the simulation upon reaching stabilization, terminating the simulation when IO offloaded from the array and response time reduction is stabilized, cache utilization is 100 percent, a cache miss percentage is equal to a cache eviction percentage, or a number of cache misses per second is within a predetermined relation to the number of cache evictions per second, receiving real-time delivery of IO events, and/or outputs of the simulator include: IOPS, Read percentage, Average IO size, simulated cache hits/misses, simulated expected response time reduction, simulated IO percentage offloaded from the array, simulated cache size used and the corresponding hits ratio, and IO size/response time distribution.

In another aspect of the invention, an article comprises: a non-transitory computer-readable medium having stored instructions that enable a machine to: receive a selection of disks in a storage system for simulation in a simulator of a server cache application; receive simulation parameters; run a simulation for the disk selection; examine results of the simulation; adjust ones of the simulation parameters; and re-run the simulation for the disk selection.

The article can further include one or more of the following features: the simulation parameters include cache page size, cache utilization limit, and IO skip size, instructions to determine whether a IOPS threshold is exceeded, instructions to adjust one of the simulation parameters such that a cache page size equals an average IO size, a cache device has a size greater than or equal to an active working set size, a cache utilization limit is greater than or equal to the active working set size, or an IO skips size is greater than a cache page size, instructions to terminate the simulation upon reaching stabilization, instructions to terminate the simulation when IO offloaded from the array and response time reduction is stabilized, cache utilization is 100 percent, a cache miss percentage is equal to a cache eviction percentage, or a number of cache misses per second is within a predetermined relation to the number of cache evictions per second, instructions to receive real-time delivery of IO events, and/or outputs of the simulator include: IOPS, Read percentage, Average IO size, simulated cache hits/misses, simulated expected response time reduction, simulated IO percentage offloaded from the array, simulated cache size used and the corresponding hits ratio, and IO size/response time distribution.

In a further aspect of the invention, a system comprises: a memory; and a processor coupled to the memory, the processor and memory configured to: receive a selection of disks in a storage system for simulation in a simulator of a server cache application; receive simulation parameters; run a simulation for the disk selection; examine results of the simulation; adjust ones of the simulation parameters; and re-run the simulation for the disk selection.

The system can further include one or more of the following features: the simulation parameters include cache page size, cache utilization limit, and IO skip size, determine whether a IOPS threshold is exceeded, adjust one of the simulation parameters such that a cache page size equals an average IO size, a cache device has a size greater than or equal to an active working set size, a cache utilization limit is greater than or equal to the active working set size, or an IO skips size is greater than a cache page size, terminate the simulation upon reaching stabilization, terminate the simulation when IO offloaded from the array and response time reduction is stabilized, cache utilization is 100 percent, a cache miss percentage is equal to a cache eviction percentage, or a number of cache misses per second is within a predetermined relation to the number of cache evictions per second, receive real-time delivery of IO events, and/or outputs of the simulator include: IOPS, read percentage, average IO size, simulated cache hits/misses, simulated expected response time reduction, simulated IO percentage offloaded from the array, simulated cache size used and the corresponding hits ratio, and IO size/response time distribution.

BRIEF DESCRIPTION OF THE DRAWINGS

The foregoing features of this invention, as well as the invention itself, may be more fully understood from the following description of the drawings in which.

DETAILED DESCRIPTION

Embodiments of the invention provide methods and apparatus for a simulator for a server caching application that reduces latency and accelerates throughput to improve application performance. In some embodiments, intelligent caching is based upon flash technology. The simulated caching application accelerates IO operations and protects data by caching the data from/to networked storage, for example. Simulator embodiments enable users to investigate potential caching application benefits in a production environment prior to installation of the caching application.

Figure 1:
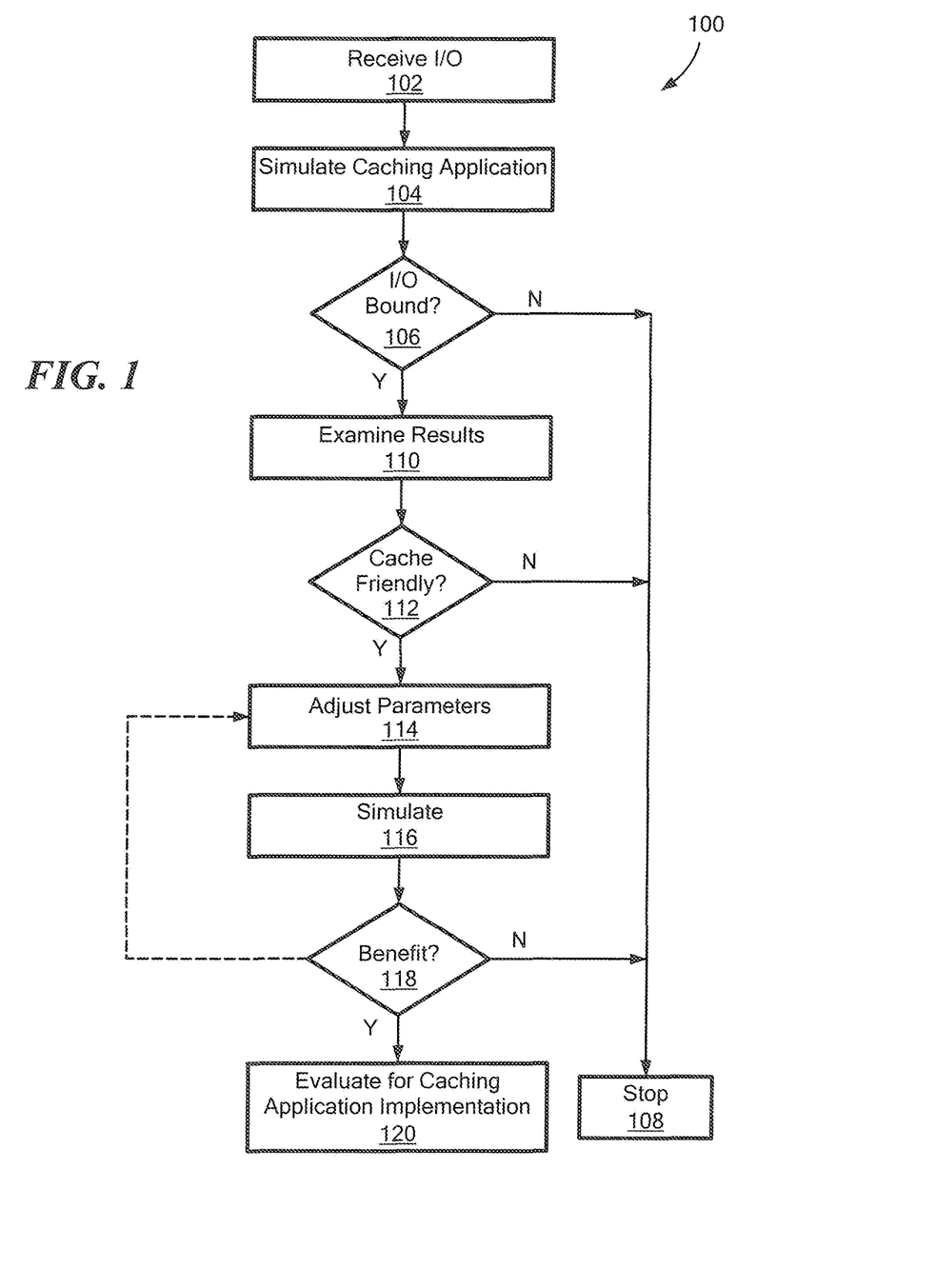
FIG. 1 is a flow diagram showing an illustrative sequence of steps for server cache simulation.

FIG. 1 shows an illustrative caching simulator environment 100 in which a given potential implementation can be simulated with an I/O stream 102 that is used to perform the simulation 104. In one embodiment, default parameters can be used for the initial simulation pass. It is determined 106 whether the simulation is I/O bound. That is, I/O operations occur in high frequency or with large latency while CPU/memory utilization is not highly intensive. If not IO bound, the simulation stops 108. The initial simulation results can be examined 110 to determine 112 whether the implementation is 'cache friendly.' If not, the simulation can stop 108. It will be appreciated that certain applications, such as data streaming for large storage space, are not cache friendly in that caching does not improve performance. For example, an application may go through the entire storage without reusing any data except rescan. In other words, the cached pages are never referenced any more before they are replaced with the newly processed data.

After the initial simulation pass, caching/system parameters can be adjusted 114 to see if caching performance can be improved, as described more fully below. For example, the size of the cache may be enlarged, or the speed of the cache can be increased, as also described more fully below. Simulation results can be evaluated to determine caching benefits 118 with the adjusted parameters. If there is no discernible benefit, the simulation can be stopped 108. Based on the benefit evaluation 118, parameters can be again adjusted 114 and evaluated based upon predetermined criteria. Upon completion of the simulation with desired parameter adjustments, an actual caching application implementation can be evaluated 120.

Before further describing simulator embodiments, illustrative caching application environments that can be simulated are described.

In illustrative embodiments a server flash caching application reduces latency and increases throughput by accelerating reads and protecting data by using a write-through cache to a networked storage to deliver persistent high availability, integrity, and disaster recovery in a networked infrastructure that is dynamically optimized for performance, intelligence, and protection for both physical and virtual environments. The caching application can provide performance acceleration for read-intensive workloads, a write-through cache to enable accelerated performance with the protection of the back-end, networked storage array, an intelligent path for the I/O, and performance in physical and virtual environments.

Illustrative terms include:

Cache page: The smallest unit of allocation inside the cache, typically a few kilobytes in size, such as 8 KB.

Cache warm-up: The process of promoting new pages into the caching application after the pages have been referenced, or a change in the application access profile that begins to reference an entirely new set of data.

Cache promotion: The process of copying data from a SAN storage in the back end to the caching application.

Hot spot: A busy area in a source volume.

Spatial locality of reference: The concept that different logical blocks located close to each other will be accessed within a certain time interval.

Temporal locality of reference: The concept that different logical blocks will be accessed within a certain time interval.

Working set: A collection of information that is accessed frequently by the application over a period of time.

Data deduplication: Eliminating redundant data by storing only a single copy of identical chunks of data, while keeping this data retrievable.

In illustrative embodiments, flash storage technology is used as:

direct-attached storage
a cache in a server
a cache in an array
a storage tier in an array
an all-flash array It is understood that any practical flash storage type can be used having different cost structures, endurance considerations, performance characteristics, and the like, such as NAND-based flash cell technologies including single-level cell (SLC) and multi-level cell (MLC), where a cell is the smallest unit of storage in a flash technology used to hold an electronic charge.

Storage tiering can be also be used in the caching application. For example, EMC Corporation provides fully automated storage tiering (FAST) processing on storage arrays that can place application data in the 'right' storage tier based on the frequency with which data is being accessed. The caching application can extend FAST processing from the storage array into the server by identifying the most frequently accessed data and promoting it into a tier that is closest to the application.

The caching application can improve application response time and deliver more IOPS by determining through FAST or other storage tiering processing which data is the 'hottest' and therefore benefits by sitting in the server on PCIe flash, for example, and closer to the application. This avoids latencies associated with I/O accesses over the network through to the storage array. Once enough data from the application working set has been promoted into server flash device, future accesses to the data will be at very low latencies. Because the processing power required for an application's most frequently referenced data is offloaded from the back-end storage to a PCIe card for example, the storage array can allocate greater processing power to other applications.

As data ages and 'cools,' this copy can be discarded where FAST can move the data to the appropriate tier of the storage array—from flash drives to FC/SAS drives and SATA/NL-SAS drives over time. The caching application can ensure protection of data by making sure that all changes to the data continue to persist down at the storage array, and use high availability and end-to-end data integrity checks.

The caching application offloads a portion of I/O processing from the storage array to the server where the caching application is installed. As caching applications are installed on more servers in the environment, more I/O processing is offloaded from the storage array to the servers, which results in a highly scalable I/O processing storage model. Disk drives may become less busy and can be reclaimed and used for other applications.

Since the caching applications are installed in the servers instead of the storage, it provides flexibility when multiple applications access the same storage, which improves the performance of the application on the server where it is installed, while other applications on other servers continue to get good performance from the storage system.

In illustrative embodiments, the caching application can be configured at the server volume level. If there are certain volumes, like application logs, which do not need to be accelerated, those specific devices can be excluded from the list of accelerated volumes. In a virtual environment, the caching application can provides the flexibility to select the virtual machines and their source volumes that should be accelerated.

Figure 2:
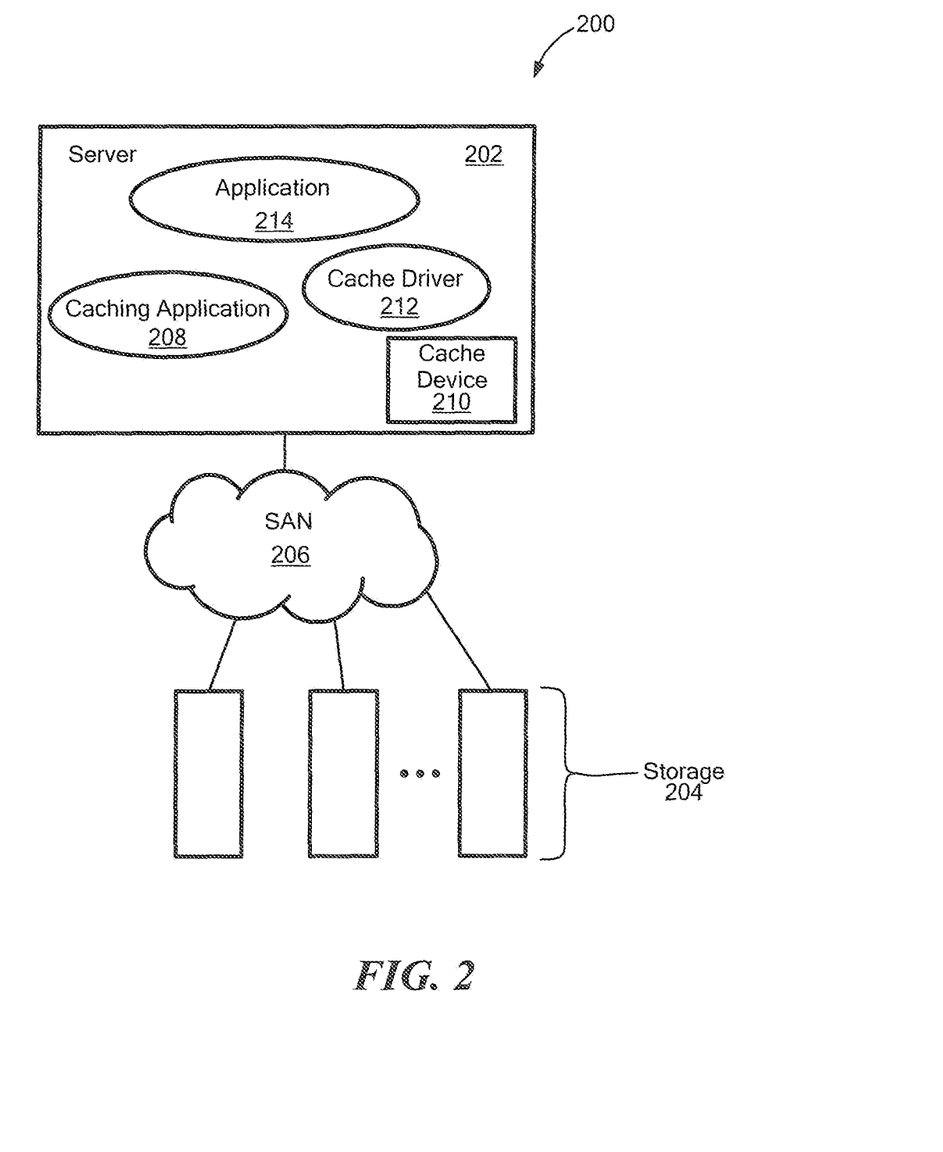
FIG. 2 is a schematic representation of a storage system having a server cache application.

FIG. 2 shows an illustrative storage system 200 including a server/host 202 coupled to SAN storage 204 via a storage area network (SAN) 206. The server 202 includes an installed caching application 208, cache device 210, and cache driver 212. It is understood that cache memory can be considered as memory cache 210. An application 214 running on the server 202 accesses the storage 204 via the caching application 208.

The cache driver 212 acts as an I/O filter driver in the I/O path inside the operating system. One or more back-end storage 204 LUNs or logical volume manager volumes are configured to be accelerated by the caching application 208. I/Os from the application 214 to an accelerated LUN or volume are intercepted by the cache filter driver 212.

Figure 2A:
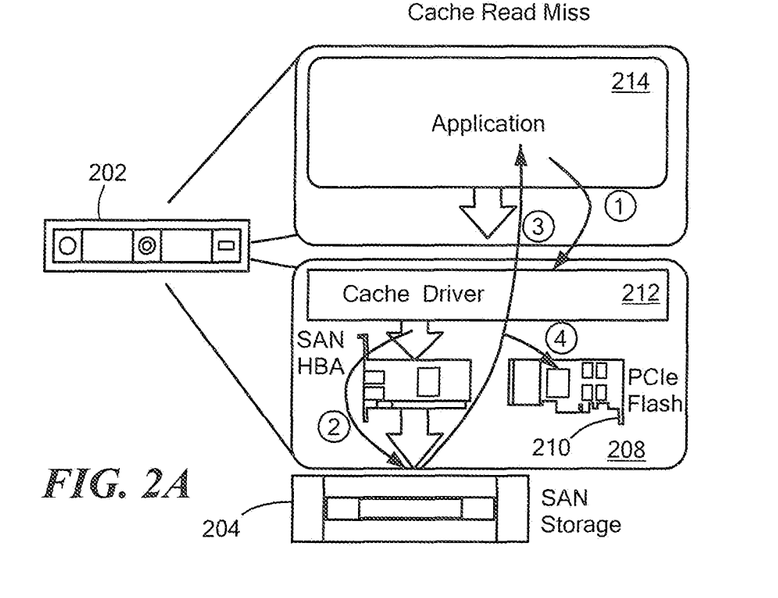
FIG. 2A is a schematic representation of a cache read miss operation.

FIG. 2A shows a read miss operation. The application 214 issues a read request that is intercepted by the cache driver 212, which determines that the requested data is not in cache device 210 and forwards the request to the back-end storage 204. The data is read from the back-end storage 204 and returned to the application 214. Once the application 214 read request is completed, the cache driver 212 writes the requested data to the cache device 210, which is referred to as promotion.

In a read hit operation, if the data for a read request by the application 214 is determined to be in cache device 210, the data is retrieved from cache device and returned to the application.

In embodiments, if the application I/O is for a source volume on which the caching application has not been enabled, the cache driver is transparent to the application I/O, and it gets executed in the same manner as if there was no cache driver in the server I/O stack.

Figure 2B:
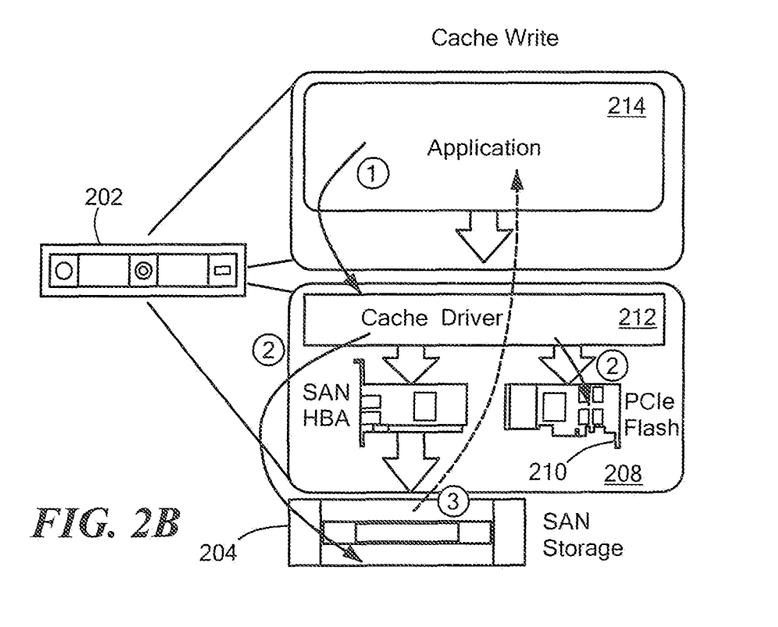
FIG. 2B is a schematic representation of a cache write operation.

FIG. 2B shows a data write operation. The application 214 issues a write request that is intercepted by the cache driver 212. Since this is a write request, the cache driver 212 passes this request to the back-end storage 204 for completion, and the data in the write request is written to the cache device 210 in parallel. If the application is writing to a storage area that has already been promoted into cache device, the copy of that data in cache device is overwritten. The application therefore will not receive a stale or old version of data. Cache processing ensures that if the application 214 writes some data and then reads the same data later on, the read requests will find the requested data in cache device 210.

Once the write operation is completed on the back-end storage 204, an acknowledgment for the write request is sent back to the application 214. The process of promoting new data is referred to as "cache warmup." Cache device needs to be warmed up with the application working set before the application starts seeing the performance benefits. When the working set of the application changes, the cache will automatically warm up with the new data over a period of time.

In other embodiments, a caching application is provided in a virtualized environment, such as a VMware environment, in which multiple virtual machines on the same server may share the performance advantages of a single cache device card, for example.

In general, one factor in maximizing cache performance is the locality of reference in the application workload. Applications that reference a small area of storage with very high frequency will benefit the most from using a caching application. Examples include database indexes and reference tables. If the locality of reference is low, the application may get less benefit after promoting a data chunk into cache. Very low locality will result in few or no promotions and thus little or benefit.

A caching application needs some warm-up time before it shows significant performance improvement. Warm-up time includes promotion operations into cache device, such as during installation and when the working dataset of the application has changed dramatically, and the current cache data is no longer being referenced. During this phase, the cache read-hit rate is low, so the response time is more like that of the SAN storage. As the hit rate increases, the performance improves and stabilizes when a large part of the application working set has been promoted into cache.

Among other things, warm-up time depends on the number and type of storage media in the back-end SAN storage. For example, a setup of 80 SAS drives will have a shorter warm-up time than a setup with 20 SAS drives. Similarly, a setup with SAS hard-disk drives (HDDs) in the back end will warm up faster than with NL-SAS HODs in the back end. This is because NL-SAS drives typically have a higher response time than SAS drives. When designing application layouts, one should remember that there is a warm-up time before stable cache performance is reached.

Warm-up time can be speeded up by reading sequentially through the test area in 64 KB I/O size. Once the working set has been promoted, the benchmark test can be run again to compare the numbers with the baseline numbers. CLI commands can be used to find out how many pages have been promoted into cache. This gives an idea of what percentage of the working set has been promoted into the cache.

When comparing the performance against PCIe flash DAS solutions, the initial performance numbers will be less because the cache needs to warm up before the stable performance numbers are shown. For DAS solutions, all read and write operations happen from the PCIe flash and there is no warm-up phase. Therefore, initial performance numbers should not be compared between a caching and a DAS solution.

Another performance benefit from a caching application depends on the application workload characteristics. It may be that cache should not be enabled for storage volumes that do not have a suitable workload profile. This provides more caching resources available for those volumes that are a good fit for caching. For example, the read/write ratio can correspond to performance. Since the caching application provides read acceleration, the higher the read/write ratio of the workload, the better the performance. In addition, the working set size of the application relative to the cache size can impact performance. If the working set is smaller than the cache size, the whole working set will get promoted into the cache which will increase performance. However, if the working set is much bigger than the cache, the performance benefit will be less. The maximum performance benefit is for those workloads where the same data is read multiple times or where the application reads the same data multiple times after writing it once.

It is understood that random and sequential workloads will have difference performance characteristics. A storage array may be efficient in processing sequential workloads from applications. The storage array may use its own cache and other mechanisms such as "prefetching" to accomplish this. However, if there is any randomness in the workload pattern, the performance is lower because of the seek times involved with accessing data on mechanical drives. The storage array cache is also of limited use in this case because different applications that use the storage array will compete for the same storage array cache resource. Flash technology does not have any latency associated with seek times to access the data. A caching application may therefore display maximum performance difference when the application workload has a high degree of random component.

It is understood that mechanical drives in a storage array may have only one or two read/write heads, which means that only a limited number I/Os can be processed at anyone point in time from one disk. When there are multiple threads in the application that try to access data from the storage array, response times tend to go up because the I/Os need to wait in the queue before they are processed. However, storage and caching devices using Flash technology typically have multiple channels internally that can process multiple I/Os simultaneously. The application should request multiple I/Os simultaneously.

Large I/O sizes tend to be bandwidth-driven and reduce the performance gap between Flash technology and non-Flash technologies. Applications with smaller I/O sizes (for example, 8 KB) display the maximum performance benefit when using a caching application.

There are some applications that can "push" the storage environment to the limit to provide as many IOPS as possible. Using a caching application in those environments will show very high IOPS at very low response times. However, there are also applications that do not require very high IOPS, but they require very low response times. Caching application benefits can be seen in these application environments. Even though the application issues relatively few I/Os, whenever the I/Os are issued, they will be serviced with a very low response time. For example, a web application may not have a lot of activity in general, but whenever a user issues a request, the response will be quick.

While a caching application can improve throughput and reduce latencies for the applications, any drastic improvement in application throughput may expose new underlying performance bottlenecks or anomalies. Addressing these may include application tuning, such as increasing buffer cache sizes or other changes that increase concurrency. For example, in a typical customer deployment, a Microsoft SQL Server administrator should not enable caching on the log files. An inefficient storage layout design of the log files may be exposed as a bottleneck when caching improves the throughput and latency of the SQL Server database.

It is understood that write performance depends on the back-end array. A caching application provides acceleration to read I/Os from the application. Any write operations that the application issues still happens at the speed that the backend storage array can provide. At a fixed read/write ratio from an application, this tends to limit the net potential increase in read throughput. For example, if the storage array is overloaded and is processing write operations at a very slow rate, a caching application will be unable to accelerate additional application reads. Once caching has been enabled on a particular source volume, every I/O from the application needs to access the cache device, whether it is a read or a write operation. Usually, the processing capability of the caching application will be much greater than what the storage array can provide, therefore caching will not be a performance bottleneck in the data path. However, if a very large number of disks on the storage array are dedicated to a single host application, and they are fully utilized in terms of IOPS, the throughput that the storage array could provide without caching can be more than what the cache application can process. In this scenario, enabling caching may provide minimal performance benefit to the application.

Figure 3:
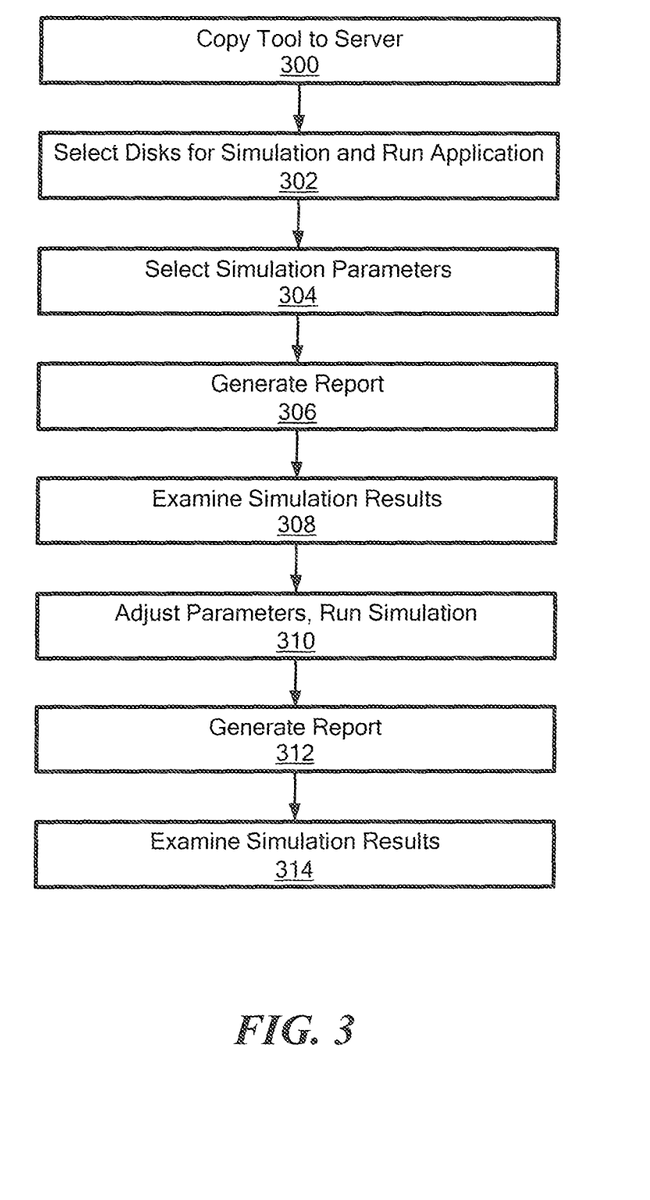
FIG. 3 is a flow diagram showing an illustrative sequence of steps for a server caching application simulation.

In one aspect of the invention, simulator for a server caching application provides a real time simulator to compute performance gains that the server caching application can deliver to a given run time environment. The simulator consumes IO events in real time while simulating cache drive behavior and processing. In an exemplary embodiment, simulator outputs include:

IOPS
Read percentage
Average IO size
Simulated cache hits/misses
Simulated expected response time reduction
Simulated IO percentage offloaded from the array
Simulated cache size used and the corresponding hits ratio (the active working set size=cache size used/hits ratio)
IO size/response time distribution FIG. 3 shows an exemplary sequence of steps for a simulator to simulate a given environment. In step 300, the tool package is copied to the production server. In one embodiment, a tool package includes the simulator executable, document, licenses for open source code and optional modules such as the pdf report generator executable/graphic files/dynamic libraries and the cache device performance data files for overriding when needed. In step 302, the tool is run and array disks for simulation are selected by the user. In step 304, simulation parameters are selected, such as (i) cache page size, (ii) cache device, (iii) cache utilization limit and (iv) IO skip size. In step 306, a simulation report is generated. In general, the simulation is terminated when the simulation is stabilized. Simulation stabilization is indicated by the following conditions:

IO offloaded from the array and the response time reduction is no longer changing wildly.
The cache utilization is 100 percent.
The cache miss percentage is equal to, or is approaching, the cache eviction percentage.
The number of cache misses per second is close to the number of cache evictions per second.

In step 308, the simulation results are examined to determine, for example, whether IOPS is high and whether there are any array disks that contribute many slow reads of mediate sizes. If not, the simulation can be stopped. In step 310, the tool is run again with disks selected that contribute slow reads of mediate size and simulation parameters set up, for example, such that:

cache page size=average IO size
cache device whose size>=the active working set size
cache utilization limit>=the active working set size
IO skips size>cache page size and covering most IOs In step 312, the simulation report is generated and terminated whenever the simulation is stabilized. In step 314, the simulation results are checked against, for example, whether simulated expected response time reduction is sufficient, and stop if not, and whether simulated IO percentage offloaded from the array is sufficient, stop if not.

In illustrative embodiments, a server cache simulator is implemented as a user space utility that is easy to install, start, and stop without requiring a system reboot. In one WINDOWS-based embodiment, the simulator can be considered as an enhanced xperf with a graphical interface. Both xperf and the simulator implement a controller to manage the IO event session, which are based on the Event Tracing for WINDOWS infrastructure (ETW). While xperf relies on temporary files to log IO events and translate the binary data into the text format, the simulator is a real time IO consumer that handles the binary data directly and presents the simulation results in run-time via a simulator GUI, for example.

Figure 4:
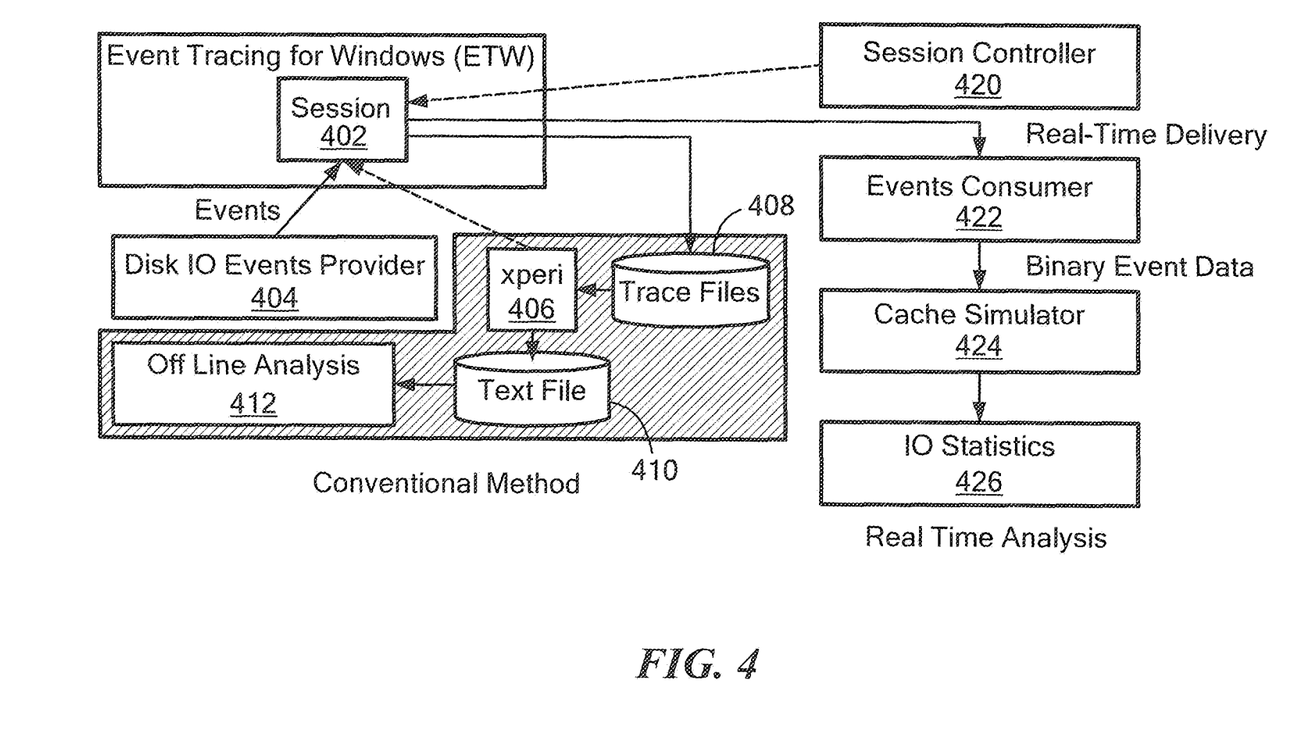
FIG. 4 is a schematic diagram showing a prior art simulation an illustrative real time server caching simulation.

FIG. 4 shows a conventional approach and an inventive simulator approach. An event tracing for WINDOWS (ETW) session 402 receives events from a disk IO events provider 404. A xperf module 406 receives data from a trace file module 408, which is coupled to session 402, and provides data to a text file 410, which can be analyzed offline 412.

In a simulator embodiment, a session controller 420 is coupled to the session 402. An events consumer module 422 receives real-time delivery of data from the session 402 and provides binary event data to a simulator 424. A statistic module 426 analyzes the simulator output data.

Since storage systems are used during their life time, a short time profiling is generally insufficient for investigating their caching behavior, especially for relatively large cache drives, which take a long time to warm up. However, long duration profiling challenges any non-real time methods which end up with time consuming steps including tracing as long as possible, transferring huge trace files, and performing long time trace analysis. Consider the following I/O loads as an example.

| Server IO Load Parameters (Random Reads) | | | |
|---|---|---|---|
| Array Size (TB) | 5 | | |
| Work Set Size (TB) | 1 | Hit Percentage | 80 |
| IO Size | 8192 | | |
| IOPS (K/s) | 20 | | |

For the loads above, the warm up cost (256B per IO event) for different cache drives are listed in the table below:

| Cache Device Size | | Warm Up Cost | | |
|---|---|---|---|---|
| Device Name | Size (B) | IOs | Time (s) | Trace Size (GB) |
| 350 GB SLC | 350073335808 | 42733562 | 2137 | 10.3 |
| 550 GB MLC | 549755813888 | 67108864 | 3355 | 16.1 |
| 700 GB SLC | 700146671616 | 85467123 | 4273 | 20.5 |
| 2200 GB MLC | 2199023255552 | 268435456 | 13422 | 64.4 |

To study the caching benefit, the working set should be traversed at least once, which leads to the low bound for the cost as follows

| Initial Work Set Traverse Cost | |
|---|---|
| Size (B) | 1374389534720 |
| IOs | 167772160 |
| Time (s) | 8389 |
| Trace Size (GB) | 40.3 |

Because the load features are unknowns before any IO profiling, non-real time methods cannot predetermine how long the tracing should be, which leads to tracing without any time limit. Meanwhile, the trace has to be monitored and the tracing must be stopped before the file becomes too huge to be stored in some temporary disks.

Since non-real time methods have no run-time information concerning the server load either, they are not recommended to run in the production environment due to potential resource contention. Therefore, a typical non-real time way transfers the trace to a non-production computer before analyzing it. Depending on whether the information abstracted from the trace is sufficient or not, further tracings may be needed. Finally, the overall analysis time is long with several rounds of coordination among data center administrators, consultants and engineers.

Illustrative embodiments of the simulator combine steps in a real time fashion, in which the simulation result becomes available on the fly for the users to decide when to terminate the profiling, e.g., the simulation stabilization described above may be considered.

Figure 5:
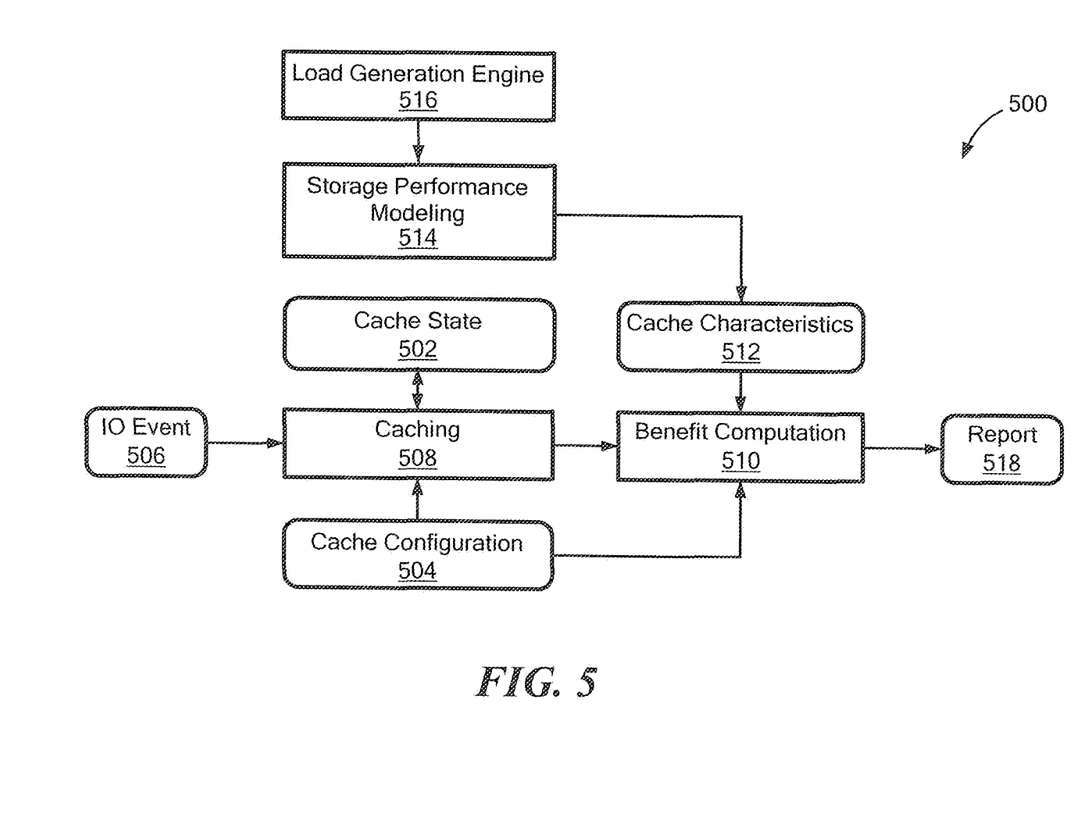
FIG. 5 is a schematic representation of a server caching application simulation system.

FIG. 5 shows an illustrative simulator system 500 that maintains a simulated cache state 502, which is initialized at the beginning with the cache configuration module 504. The cache configuration module can be determined by a user for example. Each IO event 506 is processed by a caching module 508 to determine whether the event is a hit, miss or skip, after which the cache state 502 is updated accordingly. With the caching information, the simulator computes the cache drive IOPS and read percentage such that: (i) skips, no influence to the cache drive, (ii) read hits generate reads to the cache drive and (iii) others generate writes to the cache drive.

For each read hit, a benefit computation module 510 searches for the latency specified by the cache (Drive Performance) characteristic 512. This value is used as the expected latency. Otherwise, the expected latency is equal to the latency reported by the drives under simulation. The cache drive performance characteristics are the read/write latency at specific loads, which are sliced into three dimensions: cache page size, reads ratio and IOPS. More specifically, there are six-field records: (i) cache page size, (ii) read percentage, (iii) IO depth, (iv) IOPS, (v) read latency and (vi) write latency. It is understood that there are a finite number of records in the performance model. For the IOPS missing from the model, the simulator interpolates or extrapolates the corresponding read/write latency.

A storage performance modelling module 514 relies on an IO load generation module 516 to create the performance characteristics for given any cache device. In one embodiment, the load generation module 516 runs three levels of loops to go through different cache page sizes, read percentages, IO depths and IOPS to measure latency automatically. This engine 516 can be applied to various cache device cards and the corresponding performance characteristics table is included in the simulator package. A report 518 is generated by the benefit computation module 510.

In one embodiment, the simulator 500 integrates a ranking mechanism to assign a score to each disk based on peak IOPS, read percentage, IO size and latency. The ranks are relative numbers from 0 to 15 (lower is better) that indicate the cache candidacy. In one embodiment, the ranking includes:

Accumulate: (i) Peak IOPS, (ii) Read Percentage, (iii) IO Size and (iv) Response Time in a per disk basis Convert each metric to the score of [0, 3] ([0, 12] in total) then gives the initial rank
such that, for example,
score>10: Great Candidate (rank 0)
score>=9: Good Candidate (rank 1)
score>=7: Possible Candidate (rank 2)
Otherwise: Non-Candidate (rank 15)

Downgrade candidates as follows:
Average Response Time is less than 3 ms (rank 3-5)
Overall IOPS is less than 500 (rank 6-8)
Read Percentage is less than 50 (rank 9-11)
Average IO Size is greater than 128 KB (rank 12-14)

It is understood that when users configure source drives for a caching application, they pick disks from low ranks to high ranks. The candidacy ranking helps users to filter out those disks with relatively lower latency, IOPS and reads ratio; and larger IO size with a goal of optimizing cache usage.

Figure 6:
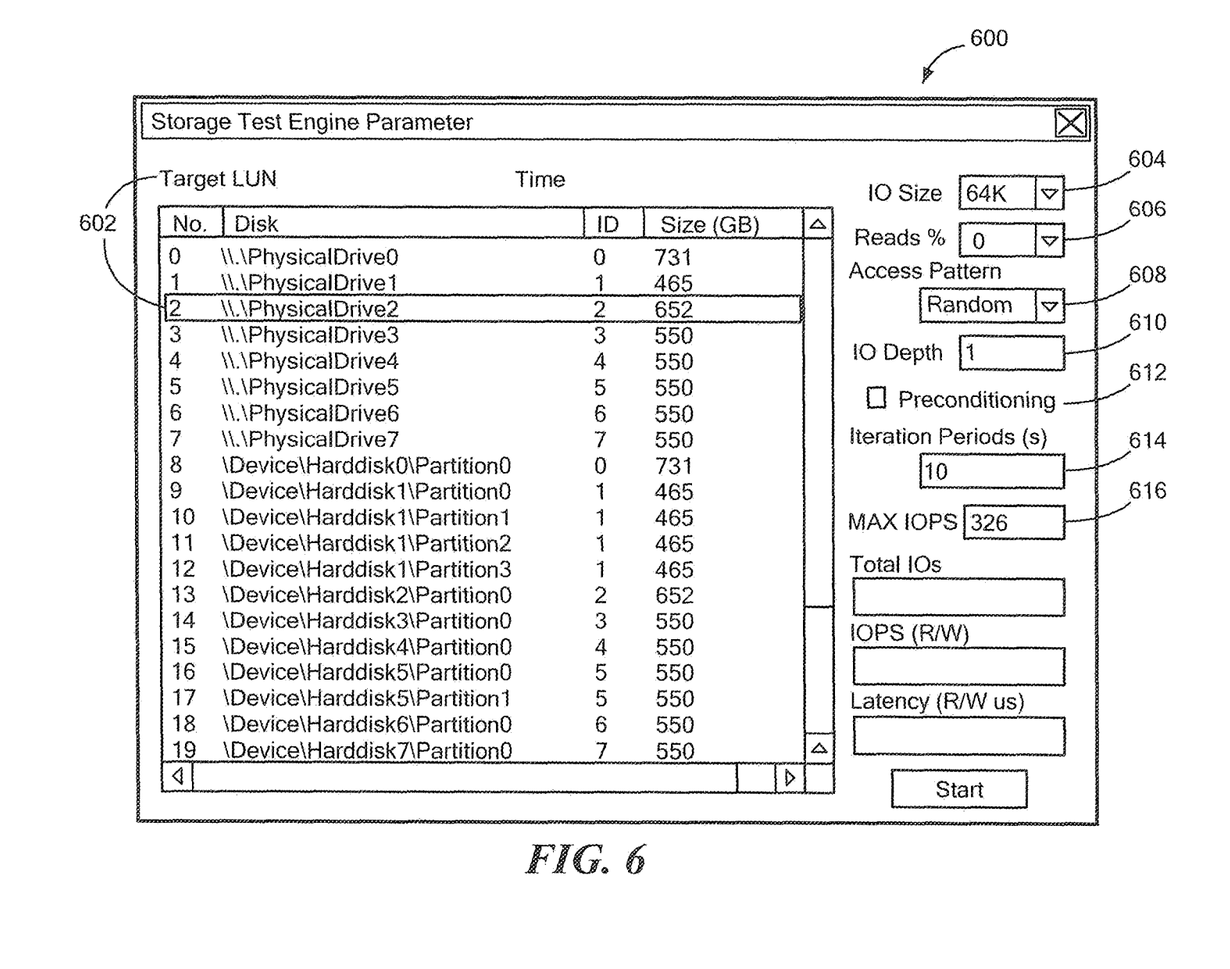
FIG. 6 is an illustrative graphical user interface for storage test engine parameters.

FIG. 6 shows an illustrative performance modeling user interface 600. The simulator uses a test engine to generate the performance model for any given storage system. The goal of the test engine is to create a performance model with reasonable granularity, as shown. The user selects/enters the load generation parameters, as listed below (default values are generally applicable).

For a target LUN 602, for example, a user can select IO size 604, such as 4K, 8K, 16K, 32K, 64K, 128K and 256K. By default, the engine traverses potential IO sizes listed above. In other cases, the user may want to test a specific IO size. For this purpose, the user starts from the targeting IO size, and then cancels the test whenever the results are sufficient. A read percentage 606 can also be selected, where for each IO size, this test sequence is run from 0 to 100% read percentage in steps of 5%. An access pattern 608 can also be selected. In one embodiment, the access pattern is random only. An IO depth 610 can also be selected. In one embodiment, a test is run for a given targeting IOPS rate at the following queue depths; 1, 2, 4, 8, 16, 32, 64, 128 and 192. Preconditioning 612 can be selected as Yes/No. Preconditioning is recommended prior to running the first test on the storage being tested to bring the storage state into the normal usage. For an all flash array case, it ensures that all of the NAND memory in the drive has been written to at least once and garbage collection is active as would be expected during normal usage. First, preconditioning writes the entire drive address space with 8 KB sequential IO. Second, preconditioning writes two times the drive address space with 8 KB random IO. Preconditioning can take a significant time depending on the speed and size of the drive under test, but it will ensure the most consistent results.

An iteration period 614 can be input, such as about 10 seconds (default). This is the test period for each of the individual tests. The default value of 10 seconds was chosen to ensure a balance between test time and accuracy. A longer test period may increase test accuracy at the expense of a longer test time. A shorter test period will reduce test time, but at reduced accuracy. A value for MAX IOPS 616 can also be provided. The engine tries to generate the IOPS via doubling the IO depth until 128; if all fail, the engine will try 192 as the last effort. In one embodiment, the initial MAX IOPS entered is also used as the step length for IOPS. And, the IOPS step length is adjusted automatically for different IO sizes to guarantee the same throughput variations. Consider the IO size 64 KB as an example, if the initial MAX IOPS is 1280, then it grows to 2560 after the 1280 IOPS is achieved. Furthermore, the initial MAX IOPS and the IOPS step length is adjusted to 10240 for the IO size 8 KB case.

Figure 7:
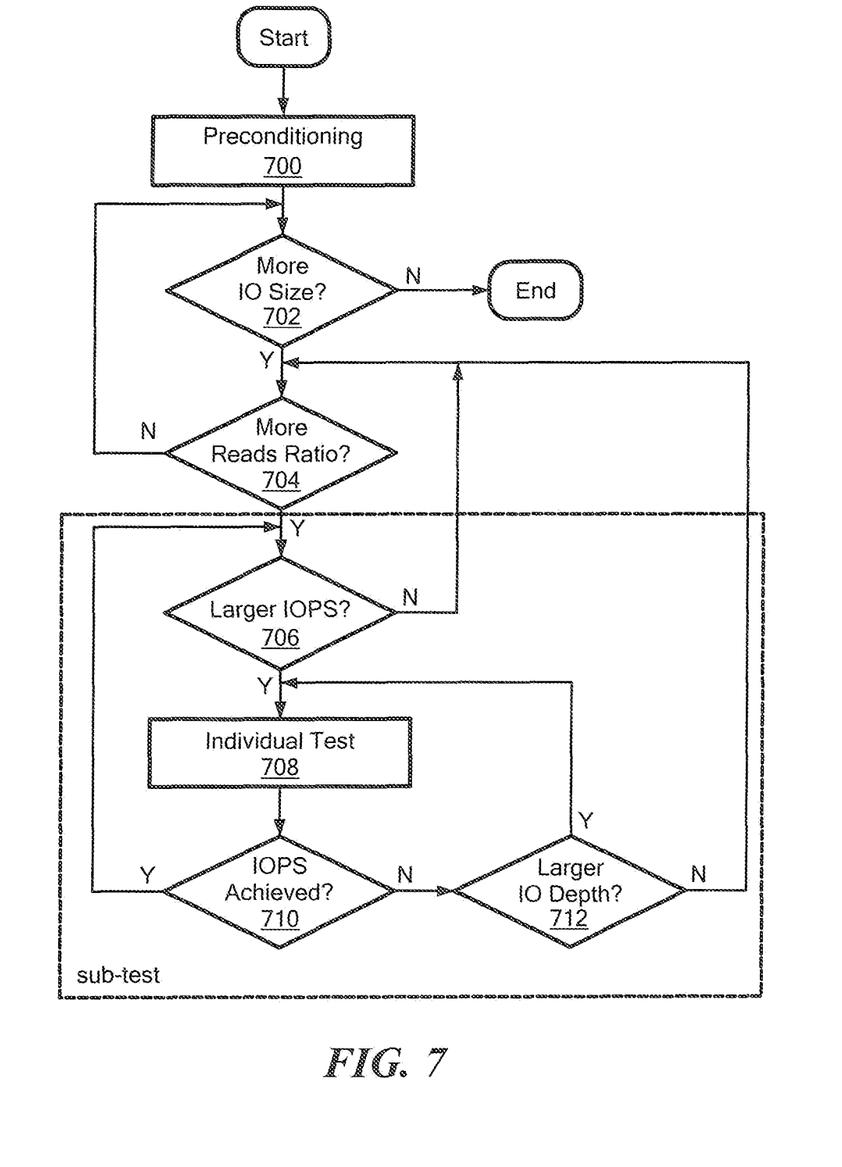
FIG. 7 is a flow diagram showing a storage test procedure.

FIG. 7 shows a storage device test with a load generation that runs three levels of loops, for example, to go through different IO sizes, read percentages, IO depths and IOPS to measure latency automatically. In step 700, preconditioning is performed. In step 702, it is determined whether there are more IO size iterations to perform. In one embodiment, enumeration for IO sizes ranges from 4 KB to 256 KB with seven iterations in total. In step 704, it is determined whether more reads ratio should be performed. In one embodiment, the enumeration for read percentages ranges from 0% to 100% in steps of 5% for a total of twenty-one iterations. So, there are 7*21 (147) sub-tests generated for traversing different IO sizes and reads ratios.

Figure 7A:
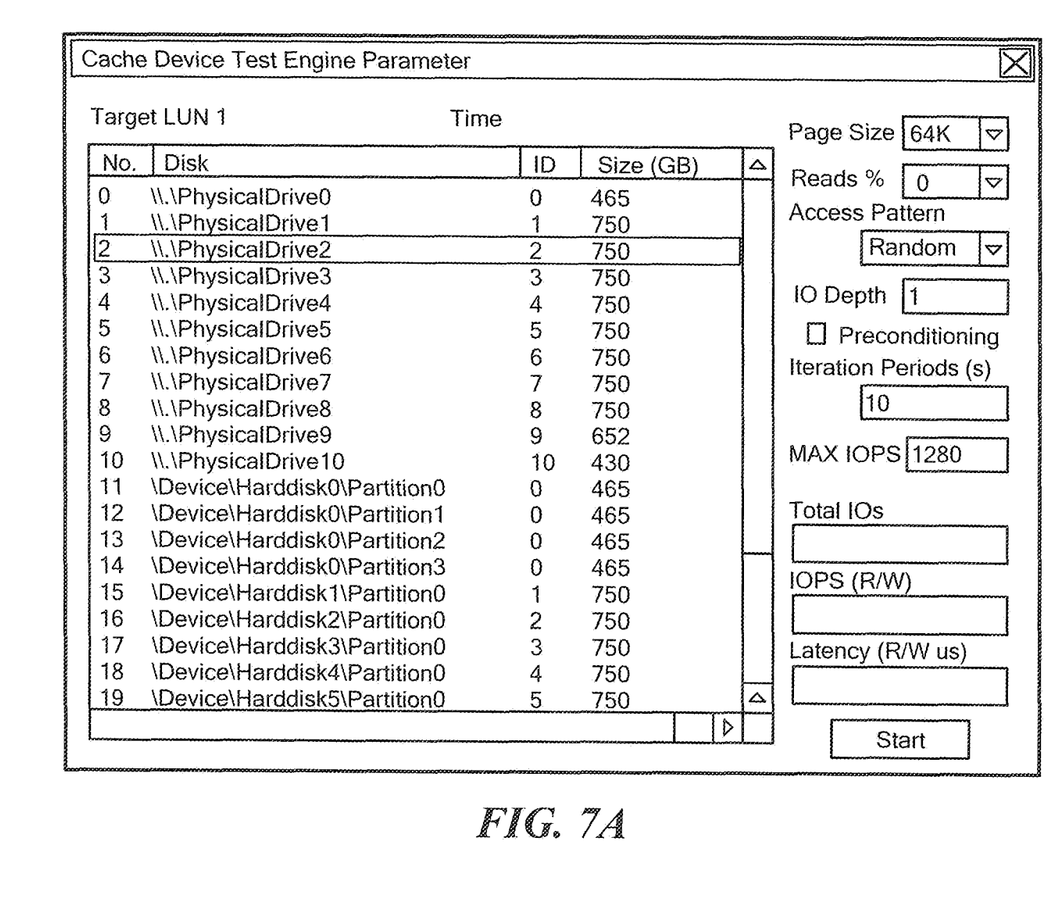
FIG. 7A is an illustrative graphical user interface for cache device test parameters.

In each sub-test, it is determined in step 706 whether a larger IOPS should be performed. If so, an individual test is performed in step 708. Larger IOPS represent the enumeration for the currently targeted IOPS, which is increased by the IOPS step length as entered/adjusted if achieved, as determined in step 710. If the currently targeted IOPS is not achieved, then the IO queue depth is doubled if determined in step 712 whether there is a larger IO depth available. The number of individual tests generated depends on the candidate peak IOPS under the IO depth 192 and the initial maximal IOPS entered (see FIG. 6). When a general storage system is used as a cache drive, just as for the simulator, the IO size corresponds exactly to the cache page size as illustrated in FIG. 7A.

Figure 8:
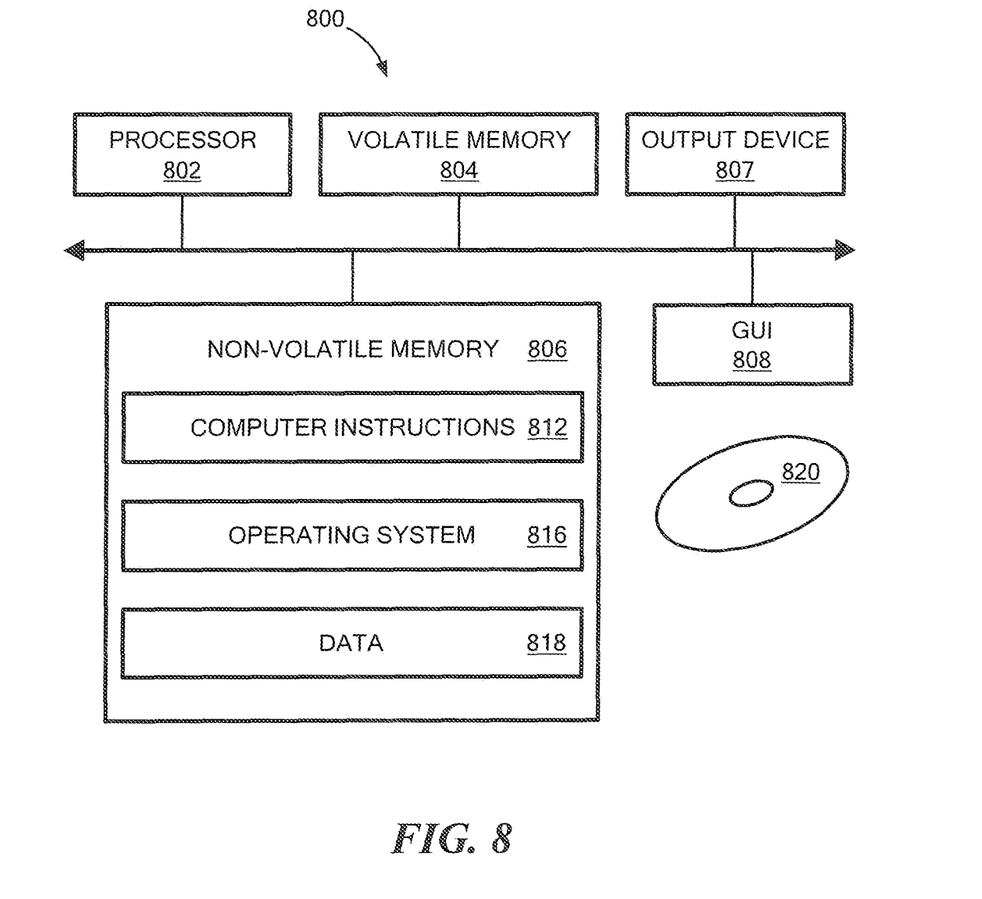
FIG. 8 is an illustrative computer that can perform at least a portion of the processing described herein.

FIG. 8 shows an exemplary computer 800 that can perform at least part of the processing described herein. The computer 800 includes a processor 802, a volatile memory 804, a non-volatile memory 806 (e.g., hard disk), an output device 807 and a graphical user interface (GUI) 808 (e.g., a mouse, a keyboard, a display, for example). The non-volatile memory 806 stores computer instructions 812, an operating system 816 and data 818. In one example, the computer instructions 812 are executed by the processor 802 out of volatile memory 804. In one embodiment, an article 820 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   receiving a selection of disks in a storage system for simulation in a simulator of a server cache application configured for write-through cache and fully automated storage tiering (FAST);
   receiving simulation parameters;
   running a simulation for the disk selection, wherein the server cache application moves data stored in a first tier of a storage array to a second tier of the storage array after a predetermined period of time has passed, wherein the server cache application offloads at least a portion of I/O processing from the storage array, wherein the server cache application is configured at a volume level, wherein at least one volume is excluded from using cache;
   examining results of the simulation;
   adjusting ones of the simulation parameters;
   re-running the simulation for the disk selection; and
   implementing a physical server cache application having the selection of disks based on the results from the simulation of the server cache application.

2. The method according to claim 1, wherein the simulation parameters include cache page size, cache utilization limit, and IO skip size.

3. The method according to claim 1, further including determining whether a IOPS threshold is exceeded.

4. The method according to claim 1, further including adjusting one of the simulation parameters such that a cache page size equals an average IO size, a cache device has a size greater than or equal to an active working set size, a cache utilization limit is greater than or equal to the active working set size, or an IO skips size is greater than a cache page size.

5. The method according to claim 1, further including terminating the simulation upon reaching stabilization.

6. The method according to claim 1, further including terminating the simulation when IO offloaded from the array and response time reduction is stabilized, cache utilization is 100 percent, a cache miss percentage is equal to a cache eviction percentage, or a number of cache misses per second is within a predetermined relation to the number of cache evictions per second.

7. The method according to claim 1, further including receiving real-time delivery of IO events.

8. The method according to claim 1, wherein outputs of the simulator include: IOPS, Read percentage, Average IO size, simulated cache hits/misses, simulated expected response time reduction, simulated IO percentage offloaded from the array, simulated cache size used and a corresponding hits ratio, and IO size/response time distribution.

9. An article, comprising:
   a non-transitory computer-readable medium having stored instructions that enable a machine to:
      receive a selection of disks in a storage system for simulation in a simulator of a server cache application configured for write-through cache and fully automated storage tiering (FAST);
      receive simulation parameters;
      run a simulation for the disk selection, wherein the server cache application moves data stored in a first tier of a storage array to a second tier of the storage array after a predetermined period of time has passed, wherein the server cache application offloads at least a portion of I/O processing from the storage array, wherein the server cache application is configured at a volume level, wherein at least one volume is excluded from using cache;
      examine results of the simulation;
      adjust ones of the simulation parameters; and
      re-run the simulation for the disk selection; and
      implement a physical server cache application having the selection of disks based on the results from the simulation of the server cache application.

10. The article according to claim 9, wherein the simulation parameters include cache page size, cache utilization limit, and IO skip size.

11. The article according to claim 9, further including instructions to determine whether a IOPS threshold is exceeded.

12. The article according to claim 9, further including instructions to adjust one of the simulation parameters such that a cache page size equals an average IO size, a cache device has a size greater than or equal to an active working set size, a cache utilization limit is greater than or equal to the active working set size, or an IO skips size is greater than a cache page size.

13. The article according to claim 9, further including instructions to terminate the simulation upon reaching stabilization.

14. The article according to claim 9, further including instructions to terminate the simulation when IO offloaded from the storage array and response time reduction is stabilized, cache utilization is 100 percent, a cache miss percentage is equal to a cache eviction percentage, or a number of cache misses per second is within a predetermined relation to the number of cache evictions per second.

15. The article according to claim 9, further including instructions to receive real-time delivery of IO events.

16. The article according to claim 9, wherein outputs of the simulator include: IOPS, Read percentage, Average IO size, simulated cache hits/misses, simulated expected response time reduction, simulated IO percentage offloaded from the storage array, simulated cache size used and a corresponding hits ratio, and IO size/response time distribution.

17. A system, comprising:
   a memory; and
   a processor coupled to the memory, the processor and memory configured to:

receive a selection of disks in a storage system for simulation in a simulator of a server cache application configured for write-through cache and fully automated storage tiering (FAST);

receive simulation parameters;

run a simulation for the disk selection, wherein the server cache application moves data stored in a first tier of a storage array to a second tier of the storage array after a predetermined period of time has passed, wherein the server cache application offloads at least a portion of I/O processing from the storage array, wherein the server cache application is configured at a volume level, wherein at least one volume is excluded from using cache;

examine results of the simulation;

adjust ones of the simulation parameters;

re-run the simulation for the disk selection; and implementing a physical server cache application having the selection of disks based on the results from the simulation of the server cache application.

18. The system according to claim 17, wherein the simulation parameters include cache page size, cache utilization limit, and IO skip size.

19. The method according to claim 1, further including determining whether the simulation is I/O bound.

20. The method according to claim 1, further including terminating the simulation based on one or more of I/O response time slows, cache utilization approaches 100 percent, cache miss percentage approaches a cache eviction percentage, and a number of cache misses per unit of time approaches a number of cache evictions per unit of time.

* * * * *